(12) United States Patent
Kim et al.

(10) Patent No.: US 10,999,959 B2
(45) Date of Patent: May 4, 2021

(54) MAGNETIC SHIELDING SHEET AND METHOD OF PREPARATION THEREOF

(71) Applicant: LG ELECTRONICS INC., Seoul (KR)

(72) Inventors: Jin Bae Kim, Seoul (KR); Dongwon Kang, Seoul (KR); Joungwook Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/796,718

(22) Filed: Feb. 20, 2020

(65) Prior Publication Data

US 2020/0275588 A1    Aug. 27, 2020

(30) Foreign Application Priority Data

Feb. 22, 2019   (KR) ........................ 10-2019-0021137

(51) Int. Cl.
*H05K 9/00* (2006.01)
*H01F 1/147* (2006.01)

(52) U.S. Cl.
CPC ........... *H05K 9/0075* (2013.01); *H01F 1/147* (2013.01)

(58) Field of Classification Search
CPC .................................................... H05K 9/0083
See application file for complete search history.

(56) References Cited

U.S. PATENT DOCUMENTS

| 7,897,882 B1 * | 3/2011 | Willwerth ............ H05K 9/0083 174/394 |
| 8,305,281 B2 | 11/2012 | Suetsuna et al. |
| 9,972,579 B1 | 5/2018 | Kawabata |
| 2014/0154469 A1 * | 6/2014 | Kagawa ............... H05K 9/0088 428/155 |

FOREIGN PATENT DOCUMENTS

| JP | 2013016833 A | 1/2013 |
| KR | 20140100347 A | 8/2014 |
| KR | 101481042 B1 | 1/2015 |
| KR | 20190009501 A | 1/2019 |
| WO | 2008/123362 A1 | 10/2008 |

\* cited by examiner

*Primary Examiner* — Hung V Ngo
(74) *Attorney, Agent, or Firm* — Dentons US LLP

(57) ABSTRACT

The present disclosure relates to a magnetic shielding sheet and a method of preparation thereof. The magnetic shielding sheet includes a magnetic layer, and a protective layer disposed on at least one surface of the magnetic layer. The magnetic layer includes a metal-ceramic composite that is metal powder, on which a ceramic coating layer is formed.

9 Claims, 3 Drawing Sheets

MAGNETIC SHIELDING SHEET AND METHOD OF PREPARATION THEREOF

CROSS-REFERENCE TO RELATED APPLICATION

The present disclosure claims priority to and the benefit of Korean Patent Application No. 10-2019-0021137, filed on Feb. 22, 2019, the disclosure of which is incorporated herein by reference in its entirety.

BACKGROUND

1. Field of the Disclosure

The present disclosure relates to a magnetic shielding sheet, compressed magnetic powder, and a method of preparation thereof.

2. Background

A metal or ceramic-based material has been used for electronic equipment to absorb electromagnetic waves that invade or radiate the electronic equipment. Recently, in order to suppress jamming according to an eddy current that occurs in a metal plate or a conductor plate adjacent to an antenna in near field communication (NFC) equipment, and to ensure communication distance and reliability, a magnetic shielding sheet is used.

A Mn—Zn ferrite material is used for a magnetic shielding material. The Mn—Zn ferrite material has a low saturation magnetization value. Accordingly, if an applied magnetic field is high, the Mn—Zn ferrite material is easily saturated, so that normal magnetic shielding function cannot be performed. In order to improve on the above problem, a thickness of the Mn—Zn ferrite material is increased. However, if the thickness of the Mn—Zn ferrite material is increased, it is difficult to apply to some of the devices and production cost increases.

Next, a magnetic metal material is used as a magnetic shielding material. With respect to the magnetic shielding material using a magnetic metal material, a saturation magnetization value can be improved compared to a ferrite material, but a high eddy current loss occurs in a high frequency band.

Therefore, a new material that combines a ceramic material and a metal material is needed. However, a coupling force between the ceramic material and the metal material is weak, and thus preparation of the composite is not easy.

SUMMARY

The present disclosure discloses a new magnetic shielding sheet in which a core loss may be reduced and excellent magnetic characteristics may be obtained.

Also, the present disclosure discloses a method of preparation of a magnetic shielding sheet for effectively combining a ceramic material and a metal material.

In order to provide a new magnetic shielding sheet in which a core loss may be reduced and excellent magnetic characteristics may be obtained, the magnetic shielding sheet according to the present disclosure includes a magnetic layer, and a protective layer disposed on at least one surface of the magnetic layer, wherein the magnetic layer includes a metal-ceramic composite that is metal powder, on which a ceramic coating layer is formed.

Also, in order to provide a method of preparing a new magnetic shielding sheet so as to effectively combine a ceramic material and a metal material, a method of preparation according to the present disclosure includes (a) preparing a metal-ceramic composite by forming a ceramic coating layer on a surface of metal powder; and (b) preparing a magnetic shielding sheet by stacking a protective layer and a magnetic layer comprising the metal-ceramic composite.

In addition, the step of (a) may include forming a ceramic coating layer in which the ceramic material is sprayed to a reactor containing metal powder by using an ultrasonic pyrolysis device, and the ceramic material is coated on a surface of the metal powder.

A magnetic shielding sheet according to the present disclosure has all of advantages of a ceramic material and a metal material, so that a core loss may be reduced and magnetic characteristics are excellent.

The magnetic shielding sheet according to the present disclosure may be prepared to be thin compared to a magnetic shielding sheet using a ferrite-based material due to the magnetic characteristics of metal powder.

Also, the magnetic shielding sheet according to the present disclosure has a feature in that a core loss is reduced compared to a metal material or a ferrite-based material.

In addition, a method of preparation of a magnetic shielding sheet according to the present disclosure may effectively combine a ceramic material and a metal material.

DETAILED DESCRIPTION OF EXEMPLARY EMBODIMENTS

The objectives, features and advantages will be described specifically hereinafter; therefore those skilled in the art may easily realize the technical sprit of the present disclosure. In describing the disclosure, detailed description of known technology in relation to the disclosure may be omitted if it is deemed to make the gist of the present disclosure unnecessarily vague. Hereinafter, a preferred embodiment according to the present disclosure will be explained specifically.

The present disclosure is not limited to embodiments disclosed hereinafter and may be realized in various different forms. Embodiments of the present disclosure are merely provided in order that the present disclosure may be complete so as to fully inform those skilled in the art in the category of the present disclosure. Hereinafter, a magnetic shielding sheet and a method of preparation thereof according to the present disclosure are specifically described.

<Magnetic Shielding Sheet>

Figure 1:
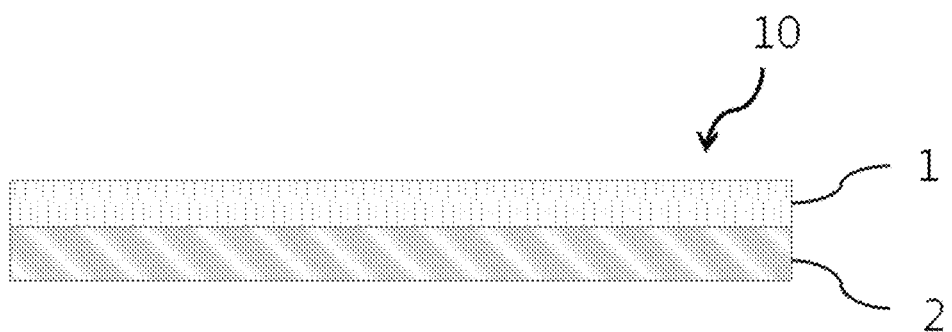
FIG. 1 is a sectional view depicting a structure of a magnetic shielding sheet according to the present disclosure.

Referring to FIG. 1, a magnetic shielding sheet 10 according to the present disclosure includes a magnetic layer 1, and a protective layer 2 disposed on at least one surface of the magnetic layer 1. The magnetic layer 1 includes a metal-ceramic composite that is metal powder, on which a ceramic coating layer is formed.

Hereinafter, configuration of the magnetic shielding sheet 10 according to the present disclosure is specifically described.

In advance, a protective layer 2 is described. In a magnetic shielding sheet 10 according to the present disclosure, the protective layer 2 is disposed on any one surface of the magnetic layer 1. The protective layer 2 has a role of protecting the magnetic layer 1 and preventing occurrence of a fragment due to a crack when a bending force is applied.

Referring to FIG. 1, the protective layer 2 is disposed on only one surface of the magnetic layer 1. However, the protective layer 2 may be disposed on both surfaces of the magnetic layer 1.

Also, the protective layer 2 may be formed as a plurality of layers other than a single layer.

A material of the protective layer 2 is not limited, and, for example, any polymer film having flexibility may be used. For example, polyethyleneterephthalate (PET), polyethylene (PE), polyimide (PI), polycarbonate (PC), or a film including a mixed material thereof may be used as the protective layer 2.

Next, the magnetic layer 1 is described. The magnetic layer 1 according to the present disclosure has a role of absorbing electromagnetic waves that invade or radiate into an electronic equipment, and includes a metal-ceramic composite that is metal powder, on which a ceramic coating layer is formed.

The magnetic layer 1 may be formed as a sintered-type sheet or a non-sintered-dry-polymeric-type sheet.

The above-described metal-ceramic composite is included in the magnetic layer 1. The metal-ceramic composite may include metal powder particles in which a ceramic coating layer is formed on a surface thereof. The ceramic coating layer may include a group of ceramic materials coated on a surface of the metal powder particles. There is no requirement that the ceramic coating layer has to be formed on an overall surface of the metal powder particles and it is fine that the ceramic coating layer is partially formed in an island shape.

Figure 2:
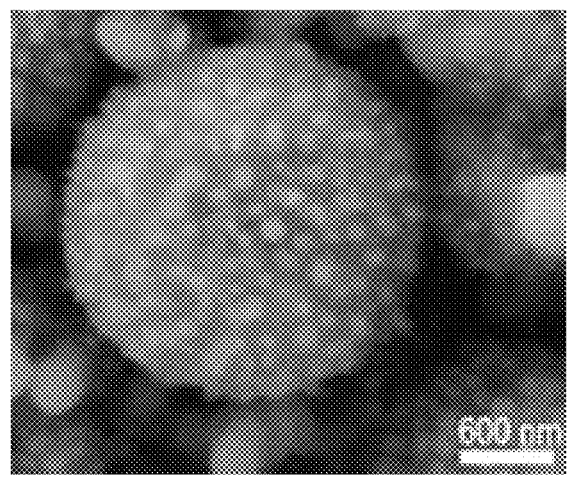
FIG. 2 is a SEM photo illustrating a metal-ceramic composite included in a magnetic shielding sheet according to the present disclosure.

Referring to a SEM photo in FIG. 2, FIG. 2 shows a metal-ceramic composite included in a magnetic layer 1. With respect to the metal-ceramic composite, the ceramic particles are coated on a surface of the metal powder particles.

Various metal materials may be used for the metal powder, but preferably, one or more metal materials selected from the group of Fe, Fe—Co, Fe—Si, Fe—Al, and Fe—Mn may be included.

Also, various ceramic materials may be used for the ceramic coating layer, but preferably, one or more ceramic materials selected from the group of MgO, $Al_2O_3$, $SiO_2$, and $Y_2O_3$ may be included.

Particularly, in a criterion of 100% by weight of the metal-ceramic composite, the metal powder may be included in a weight ratio of 60 to 90% by weight and the ceramic coating layer may be included in a weight ratio of 10 to 40% by weight. When the content of the metal powder and the ceramic coating layer satisfy the above range, a magnetic property of the magnetic layer 1 is most excellent.

From the above, the magnetic layer 1 according to the present disclosure may be formed as a sheet shape, and the magnetic layer 1 may include 50 to 80% by weight of the metal-ceramic composite in a form of powder with respect to the total weight.

A saturation magnetization value of the magnetic layer 1 is preferably 160 emu/g or more, and also a core loss value is preferably 400 kW/m3 or less at 100 kHz. A Mn—Zn ferrite material, on the other hand, has less than emu/g 100 of a saturation magnetization value, and also an eddy current loss is large, so that thickness of a magnetic layer should become more thicker. However, the magnetic layer 1 according to the present disclosure has the above-described magnetic physical property, so that thickness thereof may be thinner.

From the above, the magnetic shielding sheet 10 according to the present disclosure has the magnetic layer 1 including a metal-ceramic composite, so that an advantage of a metal material and an advantage of a ceramic material are ensured at the same time.

<Method of Preparation of Magnetic Shielding Sheet>

As described above, the magnetic shielding sheet 10 according to the present disclosure has a magnetic layer 1 including a metal-ceramic composite. The present disclosure particularly provides a method of easily preparing a metal-ceramic composite included in the magnetic layer 1.

A method of preparing a magnetic shielding sheet 10 according to the present disclosure includes (a) preparing a metal-ceramic composite by forming a ceramic coating layer on a surface of metal powder, and (b) preparing a magnetic shielding sheet by stacking a protective layer and a magnetic layer comprising the metal-ceramic composite.

In advance, the method of preparing the magnetic shielding sheet 10 according to the present disclosure includes (a) preparing a metal-ceramic composite by forming a ceramic coating layer on a surface of metal powder.

In the step of (a), various methods for forming a ceramic coating layer on a surface of the metal powder may be applied.

Preferably, the step of (a) includes preparing a precursor solution comprising a metal material and a ceramic material, and preparing a metal-ceramic composite by heat-treating the precursor solution within a reactor and passing through a partial reduction process.

More specifically, the metal material and the ceramic material may be included in the precursor solution as a form of a metal oxide. For example, if the metal material is iron (Fe) and the ceramic material is magnesium oxide (MgO), the metal material may be included in the precursor solution as a form of iron nitrate nonahydrate, and the ceramic material may be included in the precursor solution as a form of magnesium nitrate hexahydrate.

The precursor solution may include a metal oxide precursor and a solvent. The precursor may be yielded by a known method and known solvents may be used without any limitations as a solvent.

Preferably, the metal-ceramic composite in which the ceramic material is coated on a surface of the metal powder may be prepared by vaporizing the precursor solution within a reactor of an ultrasonic spray pyrolysis device, spraying the same thereto, heat-treating within the reactor, and passing through a partial reduction process.

Here, the metal powder uses various metal materials as described above but may preferably include one or more materials selected from the group of Fe, Fe—Co, Fe—Si, Fe—Al, and Fe—Mn.

Also, the ceramic coating layer may use various ceramic materials as described above but may preferably include one or more materials selected from the group of MgO, $Al_2O_3$, $SiO_2$, and $Y_2O_3$.

The ceramic material and the metal material are difficult to combine with each other due to the respective material's properties. However, according to a method of preparation according to the present disclosure, a metal-ceramic composite that can be applied to a magnetic shielding sheet and that has an excellent magnetic property may be obtained.

Next, the method of preparation according to the present disclosure includes (b) preparing the magnetic shielding sheet by stacking a protective layer and a magnetic layer comprising a metal-ceramic composite.

The step of (b) is the step of preparing a magnetic shielding sheet in which a protective layer and a magnetic layer are stacked. A way of stacking the protective layer and the magnetic layer is not particularly limited. In the step of (b), the magnetic layer may be formed on the protective layer, or the protective layer may be formed on the magnetic layer.

As one example, a magnetic layer may be formed by covering a paste including a metal-ceramic composite on a protective layer.

As another example, a magnetic layer is prepared on a sheet including a metal-ceramic composite and a protective layer may adhere to any one surface of the magnetic layer.

Hereinafter, a specific embodiment of the present disclosure is examined based on an example.

EXAMPLE

1. Example 1

As a precursor solution for synthesizing a metal-ceramic composite (Fe/MgO), the precursor solution was prepared in which a mole ratio of iron nitrate nonahydrate (98%) and magnesium nitrate hexahydrate (99%) was controlled as 7:3.

Thereafter, the precursor solution was placed in a lower part of an ultrasonic spray pyrolysis device and was sprayed by applying ultrasonic waves. The sprayed precursor solution in a state of vapor was carried to a heating part by air provided at a rate of 3 L/min as a carrier gas. The heating part placed in a center of the device was configured by two steps. In a heating part of a first step, vapor was heated at a temperature of 200° C. so that water was vaporized. In a heating part of a second step, oxide powder was prepared by heating at 500° C. According to a USP process, a metal-ceramic composite (Fe/MgO) was synthesized and yielded by putting powder collected in a paper filter of an upper part of the device into a tubular furnace, and passed thorough a partial reduction process by heating at 10° C./min of a temperature rising rate and 700° C. of a maintaining temperature during 30 minutes under atmosphere of blowing hydrogen gas in a rate of 1,000 cc/min.

A magnetic layer coating solution was prepared by charging 60% by weight of the metal-ceramic composite powder into a coating solution containing a liquid binder and a solvent, and mixing and dispersing the above in a high rate. A magnetic shielding sheet was prepared by covering the coating solution in about 3 μm of thickness on one surface of a PET film (available from SKC Co., Ltd., Republic of Korea) having 3.5 μm of thickness and drying the above.

2. Example 2

Example 2 used a metal-ceramic composite ($Fe_7Co_3$/MgO) instead of a metal-ceramic composite (Fe/MgO) of Example 1. In Example 2, a mixture of iron nitrate nonahydrate (98%) and cobalt nitrate hydrous (99%) was prepared in which a mole ratio thereof is to be 7:3. Thereafter, magnesium nitrate hexahydrate (99%) was added to the above mixture in which a ratio of a total mole of iron nitrate nonahydrate and cobalt nitrate hydrous to a mole of magnesium nitrate hexahydrate (99%) is to be 7:3. From the above, a precursor solution was prepared. The other processes were the same as those of Example 1.

3. Example 3

Example 3 used a metal-ceramic composite ($Fe_7Co_3$/$Al_2O_3$) instead of a metal-ceramic composite (Fe/MgO) of Example 1. In Example 3, a mixture of iron nitrate nonahydrate (98%) and cobalt nitrate hydrous (99%) was prepared in which a mole ratio thereof is to be 7:3, and then a mixture of the above metal oxides and aluminum nitrate nonahydrate (98%) was prepared in which a ratio of a total mole of the above metal oxides to a mole of aluminum nitrate nonahydrate (98%) was to be 7:3. Thereafter, sodium chloride (99%) was mixed with the above in which a ratio thereof is to be 3% with respect to total weight. From the above, a precursor solution was prepared. The other processes were the same as those of Example 1.

4. Comparative Example 1

A magnetic layer coating solution was prepared by charging 60% by weight of Mn—Zn ferrite powder into a coating solution containing a liquid binder and a solvent, and mixing and dispersing the above in a high rate. A magnetic shielding sheet was prepared by covering the coating solution in about 3 μm of thickness on one surface of a PET film having 3 μm of thickness and drying the above.

<Measurement of Magnetic Physical Property>

With respect to Examples 1 to 3 and Comparative Example 1, a saturation magnetization value was measured. With respect to the saturation magnetization value of each sample, a hysteresis curve value was measured by using a hysteresis curve measuring instrument (vibrating sample magnetometer, Lake Shore #7300, USA), and then the saturation magnetization value was evaluated and measured from a hysteresis curve. A loss value of each sample was measured by a BH analyzer (Iwatsu, SY-8219).

In Examples 1 to 3, a saturation magnetization value was measured as 161 (emu/g), 182 (emu/g), and 174 (emu/g), respectively. In Comparative Example 1, a saturation magnetization value was measured as 86 (emu/g). Accordingly, with respect to the magnetic shielding sheet according to the present disclosure, it was confirmed that a saturation magnetization value was improved compared to that of the existing magnetic shielding sheet.

Figure 3:
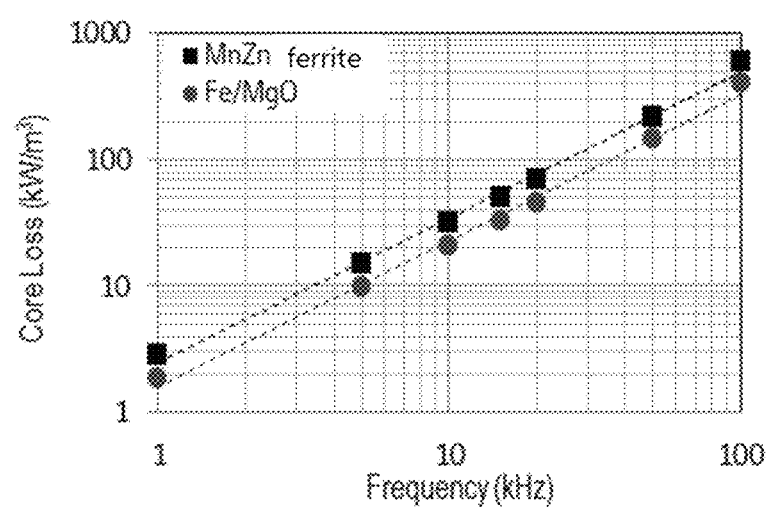
FIG. 3 is a graph presenting a core loss of an example and a comparative example according to the present disclosure.

Also, referring to FIG. 3, a comparison result of a core loss in Example 1 (Fe/MgO) and Comparative Example 1 (MnZn ferrite) are shown in a graph. With respect to a magnetic shielding sheet according to Example 1 (Fe/MgO), a loss characteristic was 400 kW/$m^3$ or less at 100 kHz, so that it was confirmed that the loss characteristic was reduced compared to that of Comparative Example 1 (MnZn ferrite).

As the above, the present disclosure is described, but the present disclosure is not limited by the disclosed embodiments and it is obvious that various modifications may be made by one having ordinary skill in the art within the scope of the technical spirit of the disclosure. Further, even though action and effects according to configuration of the present disclosure are not definitely described in the description of embodiments of the present disclosure, it is certain that predictable effects resulted from the relevant configuration should be also admitted.

What is claimed is:
1. A magnetic shielding sheet, comprising:
a magnetic layer; and a protective layer disposed on at least one surface of the magnetic layer, wherein the magnetic layer comprises a metal-ceramic composite that is a metal powder, on which a ceramic coating layer is formed, wherein a saturation magnetization value of the magnetic layer is 160 emu/g or more.

2. The magnetic shielding sheet of claim 1, wherein the metal powder comprises one or more metal materials selected from the group consisting of Fe, Fe—Co, Fe—Si, Fe—Al, and Fe—Mn.

3. The magnetic shielding sheet of claim 1, wherein the ceramic coating layer comprises one or more of ceramic materials selected from the group of MgO, $Al_2O_3$, $SiO_2$, and, $Y_2O_3$.

4. The magnetic shielding sheet of claim 1, wherein in a criterion of 100% by weight of the metal-ceramic composite, the metal powder is 60 to 90% by weight and the ceramic coating layer is 10 to 40% by weight.

5. The magnetic shielding sheet of claim 1, wherein the magnetic layer has 400 kW/m$^3$ or less of a core loss value at 100 kHz.

6. A method of preparing a magnetic shielding sheet, comprising:

(a) preparing a metal-ceramic composite by forming a ceramic coating layer on a surface of a metal powder; and (b) preparing the magnetic shielding sheet by stacking a protective layer and a magnetic layer comprising the metal-ceramic composite, wherein a saturation magnetization value of the magnetic layer is 160 emu/g or more.

7. The method of preparing the magnetic shielding sheet of claim 6, wherein the step of (a) comprises:

preparing a precursor solution comprising a metal material and a ceramic material; and preparing a metal-ceramic composite by heat-treating the precursor solution within a reactor and passing through a partial reduction process.

8. The method of preparing the magnetic shielding sheet of claim 6, wherein the metal powder comprises one or more metal materials selected from the group consisting from Fe, Fe—Co, Fe—Si, Fe—Al, and Fe—Mn.

9. The method of preparing the magnetic shielding sheet of claim 6, wherein the ceramic coating layer comprises one or more ceramic materials selected from the group consisting from MgO, $Al_2O_3$, $SiO_2$, and, $Y_2O_3$.

* * * * *